US008659294B2

(12) United States Patent
Sutton (10) Patent No.: US 8,659,294 B2
(45) Date of Patent: Feb. 25, 2014

(54) METHOD FOR ACQUIRING DYNAMIC MOTION IMAGES TO GUIDE FUNCTIONAL MAGNETIC RESONANCE IMAGING ANALYSIS OF MOTOR TASKS (75) Inventor: Bradley P. Sutton, Savoy, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 810 days.

(21) Appl. No.: 12/697,617

(22) Filed: Feb. 1, 2010

(65) Prior Publication Data
US 2010/0194389 A1 Aug. 5, 2010

Related U.S. Application Data (60) Provisional application No. 61/149,837, filed on Feb. 4, 2009.

(51) Int. Cl.
G01R 33/48 (2006.01)
(52) U.S. Cl.
USPC .......................................... 324/309; 324/307
(58) Field of Classification Search
USPC .................... 324/300–322; 382/128–131; 600/407–435; 601/104; 702/19
See application file for complete search history.

(56) References Cited

U.S. PATENT DOCUMENTS

| 7,539,528 | B2 * | 5/2009 | Xiong et al. | 600/411 |
|---|---|---|---|---|
| 7,885,700 | B2 * | 2/2011 | Clark et al. | 600/372 |
| 7,899,524 | B2 * | 3/2011 | Kozel | 600/544 |
| 2004/0096395 | A1 * | 5/2004 | Xiong et al. | 424/9.1 |
| 2005/0054910 | A1 * | 3/2005 | Tremblay et al. | 600/411 |
| 2006/0036152 | A1 * | 2/2006 | Kozel | 600/410 |
| 2006/0036153 | A1 * | 2/2006 | Laken | 600/410 |
| 2006/0058694 | A1 * | 3/2006 | Clark et al. | 600/509 |
| 2006/0074290 | A1 * | 4/2006 | Chen et al. | 600/407 |
| 2009/0156955 | A1 * | 6/2009 | Jung et al. | 600/544 |
| 2009/0157323 | A1 * | 6/2009 | Jung et al. | 702/19 |
| 2009/0164131 | A1 * | 6/2009 | Jung et al. | 702/19 |
| 2009/0164132 | A1 * | 6/2009 | Jung et al. | 702/19 |
| 2010/0010400 | A1 * | 1/2010 | Martin et al. | 601/107 |
| 2010/0194389 | A1 * | 8/2010 | Sutton | 324/309 |
| 2011/0092800 | A1 * | 4/2011 | Yoo et al. | 600/411 |
| 2012/0139537 | A1 * | 6/2012 | Holland et al. | 324/309 |

FOREIGN PATENT DOCUMENTS

WO WO 9704330 A1 * 2/1997

* cited by examiner

Primary Examiner — Melissa Koval
Assistant Examiner — Tiffany Fetzner
(74) Attorney, Agent, or Firm — Quarles & Brady, LLP (57) ABSTRACT A method for imaging neuromuscular coupling and sensory processing with magnetic resonance imaging ("MRI") is provided. More specifically, a method for examining the control that a subject's brain has over muscular motion, including both prompted and incidental actions, is provided. A dynamic acquisition is performed to rapidly acquire anatomical images of a desired muscle. This dynamic acquisition is interleaved with a functional acquisition that targets the cortical areas that are responsible for controlling, or processing, signals from the desired muscular region. By interleaving these two acquisitions, synchronized image information about the motion of the muscle along with the neuronal activity associated with the control of the muscle is acquired. Interleaving these data acquisitions also allows imaging of brain and muscle at substantially the same time, thereby reducing errors and pinpointing activity.

16 Claims, 8 Drawing Sheets

METHOD FOR ACQUIRING DYNAMIC MOTION IMAGES TO GUIDE FUNCTIONAL MAGNETIC RESONANCE IMAGING ANALYSIS OF MOTOR TASKS

CROSS-REFERENCE TO RELATED APPLICATIONS

This application claims the benefit of U.S. Provisional Patent Application Ser. No. 61/149,837 filed on Feb. 4, 2009, and entitled "Method for Dynamic Motion Guided Functional Magnetic Resonance Imaging."

BACKGROUND OF THE INVENTION

The field of the invention is magnetic resonance imaging ("MRI") methods and systems. More particularly, the invention relates to methods for functional MRI ("fMRI").

When a substance such as human tissue is subjected to a uniform magnetic field (polarizing field $B_0$), the individual magnetic moments of the nuclei in the tissue attempt to align with this polarizing field, but process about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped," into the x-y plane to produce a net transverse magnetic moment $M_{xy}$. A signal is emitted by the excited nuclei or "spins," after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically-proven pulse sequences and they also enable the development of new pulse sequences.

The MR signals acquired with an MRI system are signal samples of the subject of the examination in Fourier space, or what is often referred to in the art as "k-space." Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp," a "Fourier," a "rectilinear," or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

There are many other k-space sampling patterns used by MRI systems. These include "radial", or "projection reconstruction" scans in which k-space is sampled as a set of radial sampling trajectories extending from the center of k-space. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then performing a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

Functional magnetic resonance imaging ("fMRI") technology provides an approach to study neuronal activity. Conventional fMRI detects changes in cerebral blood volume, flow, and oxygenation that locally occur in association with increased neuronal activity that is induced by functional paradigms. This physiological response is often referred to as the "hemodynamic response." The hemodynamic response to neuronal activity provides a mechanism for image contrast commonly referred to as the blood-oxygen level dependent ("BOLD") signal contrast. An MRI system can be used to acquire signals from the brain over a period of time. As the brain performs a task, these signals are modulated synchronously with task performance to reveal which regions of the brain are involved in performing the task. The series of fMRI time course images must be acquired at a rate that is high enough to see the changes in brain activity induced by the functional paradigm. In addition, because neuronal activity may occur at widely dispersed locations in the brain, a relatively large 3D volume or multi-slice volume must be acquired in each time frame.

Typically, functional paradigms employed by fMRI fall into one of two categories: block designs and event-related designs. In block paradigms, functional tasks are organized into blocks that alternate throughout the functional scan at regular intervals. In addition, block paradigms often employ a stimulus, such as a visual or auditory cue, to perform a given task, the stimulus being presented to the subject such that a desired task is initiated. This approach can confound functional analysis, however, since unwanted neuronal activation is often produced in response to the stimulus. For example, if a subject is presented with a visual cue, neuronal activation in response to processing the visual information is produced. This neuronal activation results in cognitive function being represented in the functional images in portions of the brain where activation may not be desired, such as the visual cortex, for the particular application at task. In contrast to block paradigms, functional tasks in event-related paradigms are typically pseudo-random single events or rapid repetitions thereof. While pseudo-random in presentation, event-related paradigms still rely on predetermined timing of when functional tasks are to occur. Moreover, in many cases, external stimuli are still required to induce the desired functional task.

In general, fMRI analyses proceed by performing statistical analyses between estimates of the expected hemodynamic response and BOLD signal changes that are indicative of the functional paradigm design, that is, the timing of the functional tasks performed by the subject, utilized when acquiring the image data. A mathematical model produced around the functional paradigm thereby forms the basis for statistical analysis, focusing on voxels whose signal changes correspond to the timing of the functional task. Therefore, a priori information about the times at which a functional task is performed is required before a subject is imaged.

SUMMARY OF THE INVENTION

The present invention provides a method for functional magnetic resonance imaging ("fMRI"), and the subsequent fMRI analyses, without the need for a priori information regarding the specific timing of the performance of a functional task. More specifically, the present invention provides a method for examining the control that a subject's brain has over muscular motion, including both prompted and incidental actions. For example, the subject may be instructed to swallow, or the subject may swallow incidentally, while being imaged.

It is therefore an aspect of invention to provide an imaging method having the ability to assess the brain's command signals, or sensory processing of the muscular motion, for both prompted and incidental events. One area of impact of the method is in studying swallowing disorders.

It is another aspect of the invention to provide a method for simultaneously studying the action of muscles and the cortical processing controlling the timing of these actions. Additionally, hemodynamic response estimation techniques can be applied to estimate the functional response to incidental swallows, to assess lag between the cortical signal and the initiation of the swallowing event, and to monitor sensory feedback during the swallowing process. By studying these items for incidental swallows, as opposed to prompted, irregularities in the normal swallowing process can be more accurately identified.

It is yet another aspect of the invention to provide an extension of standard functional MRI methods, which rely on the so-called blood-oxygen level dependent ("BOLD") effect. In particular, a dynamic acquisition is interleaved with a BOLD acquisition. The dynamic acquisition acquires rapid images of a muscle while the interleaved functional BOLD acquisition targets the cortical areas that are responsible for controlling or processing signals from the region. By interleaving these two acquisitions, synchronized image information about the motion of the muscle along with its corresponding brain function is acquired. Interleaving these data acquisitions also allows imaging of brain and muscle at substantially the same time, therefore, reducing errors and pinpointing activity.

The foregoing and other aspects and advantages of the invention will appear from the following description. In the description, reference is made to the accompanying drawings which form a part hereof, and in which there is shown by way of illustration at least one embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
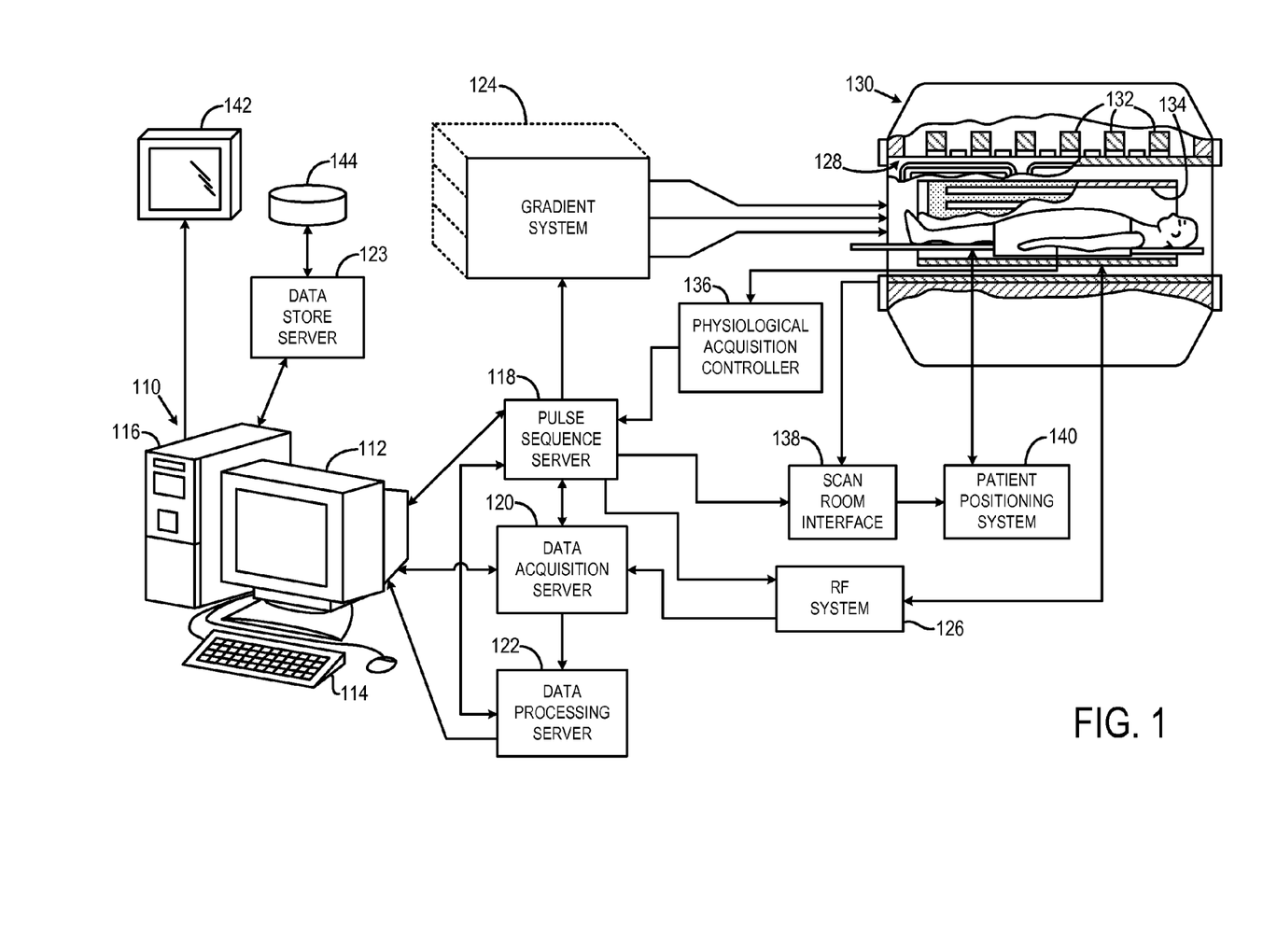
FIG. 1 is a block diagram of an exemplary magnetic resonance imaging ("MRI") system that employs the present invention.

Referring particularly to FIG. 1, the preferred embodiment of the invention is employed in a magnetic resonance imaging ("MRI") system. The MRI system includes a workstation 110 having a display 112 and a keyboard 114. The workstation 110 includes a processor 116 that is a commercially available programmable machine running a commercially available operating system. The workstation 110 provides the operator interface that enables scan prescriptions to be entered into the MRI system. The workstation 110 is coupled to four servers: a pulse sequence server 118; a data acquisition server 120; a data processing server 122, and a data store server 123. The workstation 110 and each server 118, 120, 122 and 123 are connected to communicate with each other.

The pulse sequence server 118 functions in response to instructions downloaded from the workstation 110 to operate a gradient system 124 and a radiofrequency ("RF") system 126. Gradient waveforms necessary to perform the prescribed scan are produced and applied to the gradient system 124 that excites gradient coils in an assembly 128 to produce the magnetic field gradients $G_x$, $G_y$, and $G_z$ used for position encoding MR signals. The gradient coil assembly 128 forms part of a magnet assembly 130 that includes a polarizing magnet 132 and a whole-body RF coil 134.

RF excitation waveforms are applied to the RF coil 134 by the RF system 126 to perform the prescribed magnetic resonance pulse sequence. Responsive MR signals detected by the RF coil 134 or a separate local coil (not shown in FIG. 1) are received by the RF system 126, amplified, demodulated, filtered and digitized under direction of commands produced by the pulse sequence server 118. The RF system 126 includes an RF transmitter for producing a wide variety of RF pulses used in MR pulse sequences. The RF transmitter is responsive to the scan prescription and direction from the pulse sequence server 118 to produce RF pulses of the desired frequency, phase and pulse amplitude waveform. The generated RF pulses may be applied to the whole body RF coil 134 or to one or more local coils or coil arrays (not shown in FIG. 1).

The RF system 126 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2},$$

and the phase of the received MR signal may also be determined:

$$\phi = \tan^{-1}\left(\frac{Q}{I}\right).$$

The pulse sequence server 118 also optionally receives patient data from a physiological acquisition controller 136. The controller 136 receives signals from a number of different sensors connected to the patient, such as ECG signals from electrodes or respiratory signals from a bellows. Such signals are typically used by the pulse sequence server 118 to synchronize, or "gate", the performance of the scan with the subject's respiration or heart beat.

The pulse sequence server 118 also connects to a scan room interface circuit 138 that receives signals from various sensors associated with the condition of the patient and the magnet system. It is also through the scan room interface circuit 138 that a patient positioning system 140 receives commands to move the patient to desired positions during the scan.

The digitized MR signal samples produced by the RF system 126 are received by the data acquisition server 120. The data acquisition server 120 operates in response to instructions downloaded from the workstation 110 to receive the real-time MR data and provide buffer storage such that no data is lost by data overrun. In some scans the data acquisition server 120 does little more than pass the acquired MR data to the data processor server 122. However, in scans that require information derived from acquired MR data to control the further performance of the scan, the data acquisition server 120 is programmed to produce such information and convey it to the pulse sequence server 118. For example, during prescans MR data is acquired and used to calibrate the pulse sequence performed by the pulse sequence server 118. Also, navigator signals may be acquired during a scan and used to adjust RF or gradient system operating parameters or to control the view order in which k-space is sampled. And, the data acquisition server 120 may be employed to process MR signals used to detect the arrival of contrast agent in a magnetic resonance angiography (MRA) scan. In all these examples the data acquisition server 120 acquires MR data and processes it in real-time to produce information that is used to control the scan.

The data processing server 122 receives MR data from the data acquisition server 120 and processes it in accordance with instructions downloaded from the workstation 110. Such processing may include, for example: Fourier transformation of raw k-space MR data to produce two or three-dimensional images; the application of filters to a reconstructed image; the performance of a backprojection image reconstruction of acquired MR data; the calculation of functional MR images; and the calculation of motion or flow images.

Images reconstructed by the data processing server 122 are conveyed back to the workstation 110 where they are stored. Real-time images are stored in a data base memory cache (not shown) from which they may be output to operator display 112 or a display 142 that is located near the magnet assembly 130 for use by attending physicians. Batch mode images or selected real time images are stored in a host database on disc storage 144. When such images have been reconstructed and transferred to storage, the data processing server 122 notifies the data store server 123 on the workstation 110. The workstation 110 may be used by an operator to archive the images, produce films, or send the images via a network to other facilities.

Currently, deficits in swallowing are evaluated with video fluoroscopy, which looks at the timing of a barium swallow. In these fluoroscopy-based methods, delays, displacements, or any other irregularities of the swallow are monitored. Additionally, pressure sensors can be placed in the pharynx to assess the function of the muscle. It would be advantageous, however, to provide a method for simultaneously acquiring information regarding the mechanics of a patient's swallowing and information regarding the underlying neural control of such mechanics. By interleaving a dynamic imaging pulse sequence portion with a functional imaging pulse sequence portion, images indicative of swallowing mechanics can be obtained substantially simultaneously with functional images indicative of neuronal activity. In turn, the dynamic images can be employed to retrospectively determine when the subject was swallowing, thereby allowing the retrospective production of a timing sequence to be used in analysis of the functional images. In this manner, the subject is allowed to freely swallow during the imaging study, and need not be cued to swallow. This allows a more accurate study of the subject's swallowing mechanics than was previously achievable.

Figure 2A:
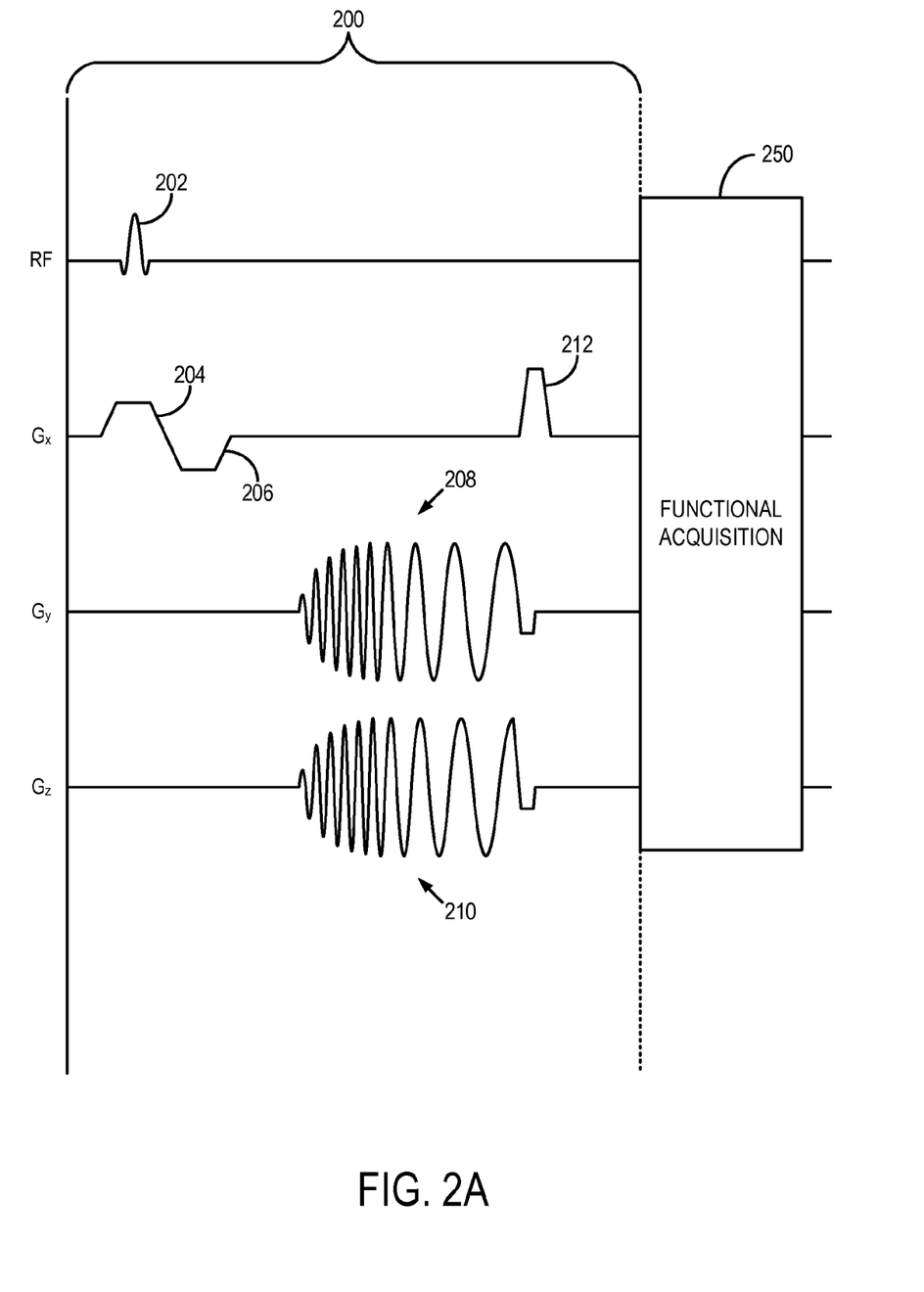
FIG. 2A is a graphic illustration of a dynamic imaging portion of a preferred pulse sequence.
Figure 2B:
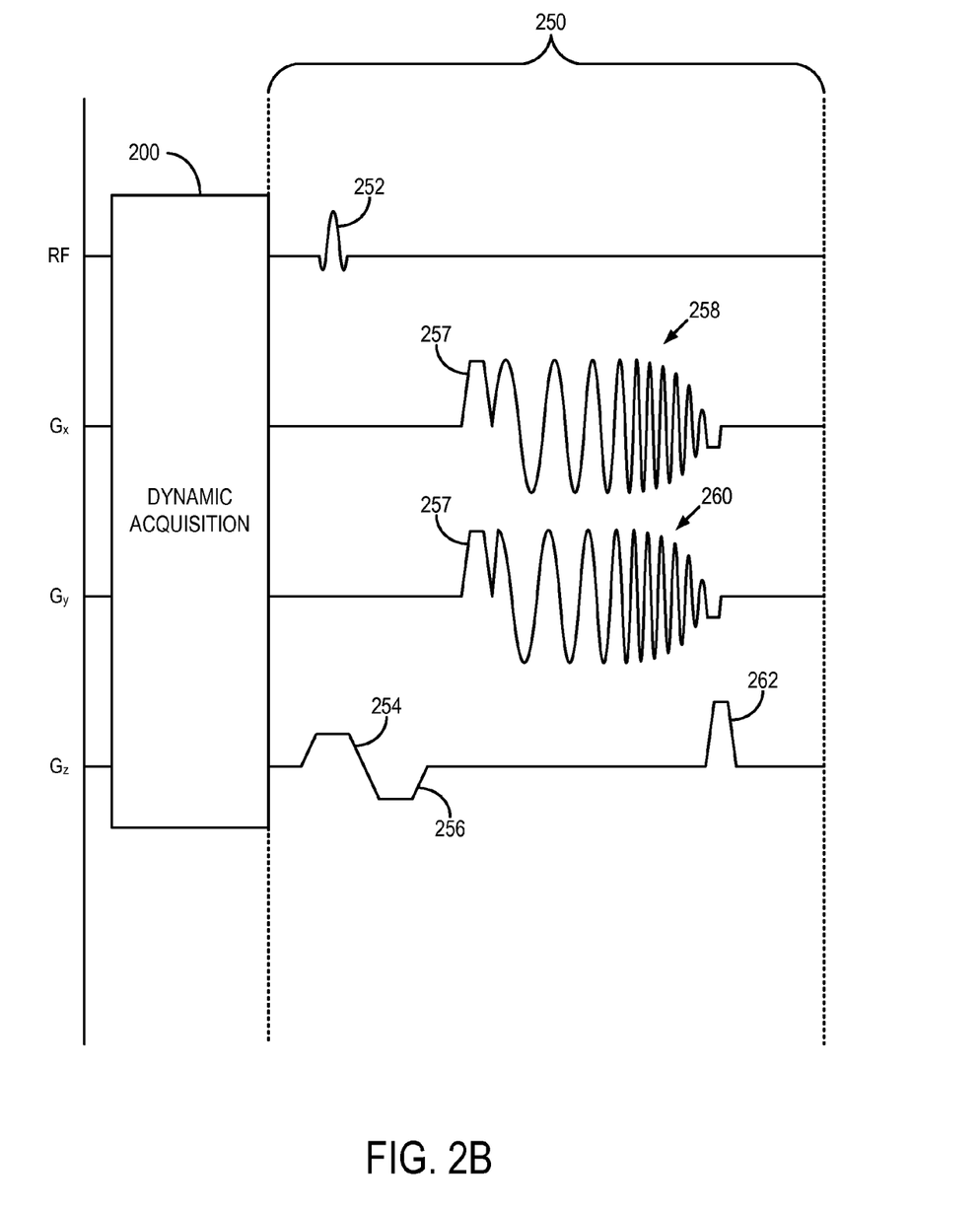
FIG. 2B is a graphic illustration of a functional imaging portion of a preferred pulse sequence.

Referring now to FIGS. 2A and 2B, an exemplary pulse sequence utilized when practicing at least one embodiment of the present invention includes a dynamic imaging portion 200 and a functional imaging portion 250. A number of different pulse sequences can be used to direct the MRI system to acquire image data during the dynamic imaging portion 200; however, in one embodiment, a spiral-out gradient recalled echo pulse sequence is employed, such as the one shown in FIG. 2A. The dynamic imaging portion 200 includes a radio frequency ("RF") excitation pulse 202 that is played out in the presence of a slice selective gradient pulse 204 in order to produce transverse magnetization in a prescribed slice. The slice selective gradient 204 also includes a rephasing lobe 206 that acts to compensate for phase dispersions in transverse magnetization produced by the slice selective gradient 204. As shown in FIG. 2A, the slice selective gradient 204 is played out along the $G_x$-axis, thus producing a sagittal slice in the subject. It will be appreciated by those skilled in the art, however, that appropriate changes can be made to the pulse sequence in FIG. 2A so that slices in different planes are selected.

After excitation of the spins in the slice, a multi-shot spiral-out spoiled gradient recalled echo acquisition is used to sample k-space. Here, a phase encoding gradient pulse 208 is applied to position encode the MR signal along one direction in the slice. A readout gradient pulse 210 is also applied to position encode the MR signal along a second, orthogonal direction in the slice. The result of playing out the phase encoding gradient 208 and the readout gradient 210 together is the sampling of k-space in a spiral-out pattern. A multi-shot acquisition covers only a portion of k-space for each repetition of the acquisition. For the multi-shot spiral, the spiral interleaf is rotated by a small amount between repetitions so as to cover the whole k-space upon a specified number of multiple applications, referred to as the number of shots. In the at least one embodiment, a 6-shot spiral acquisition is used for the dynamic imaging. After the phase encode and readout gradients, 208 and 210, are applied, a spoiler gradient 212 is applied to dephase any residual echo signal so that it does not contaminate signals acquired from later repetition time ("TR") periods. In general, the spoiler gradient 212 can be played along any of the gradient axes. Moreover, a plurality of such spoiler pulses 212 may be played out along any combination of these gradient axes.

The dynamic imaging portion 200 is repeated and the phase encoding and readout gradients, 208 and 210, are altered by stepping through a set of values to sample 2D k-space in a prescribed manner. As discussed above, this effectively rotates the spiral sampling pattern so that a different "spiral interleaf" is sampled with each repetition. In at least one embodiment, the dynamic imaging portion 200 is repeated six times before proceeding with the functional imaging portion 250 of the pulse sequence. It is noted, however, that any number of repetitions of the dynamic imaging portion 200 may be employed depending on the desired imaging application. As will be described below in detail, the dynamic imaging portion acquires MR signal from the same imaging slice during each repetition.

A number of different pulse sequences can be used to direct the MRI system to acquire functional image data during the functional imaging portion 250; however, in one embodiment, a spiral-in gradient recalled echo ("GRE") pulse sequence is employed, such as the one shown in FIG. 2B. By acquiring functional image data with a spiral-in sampling pattern, the more important central regions of k-space are sampled when the functional MRI contrast has been allowed to develop. The functional MRI contrast is based on the blood oxygenation level dependent (BOLD) contrast mechanism described above, which provides image contrast resultant from microscopic field gradients around hemoglobin that depend on its oxygenation state. The spiral-in GRE sequence includes an RF excitation pulse 252 that is played out in the presence of a slice selective gradient pulse 254 to produce transverse magnetization in a prescribed slice. The slice selective gradient 254 also includes a rephasing lobe 256 that acts to compensate for phase dispersions in transverse magnetization produced by the slice selective gradient 254.

Figure 2C:
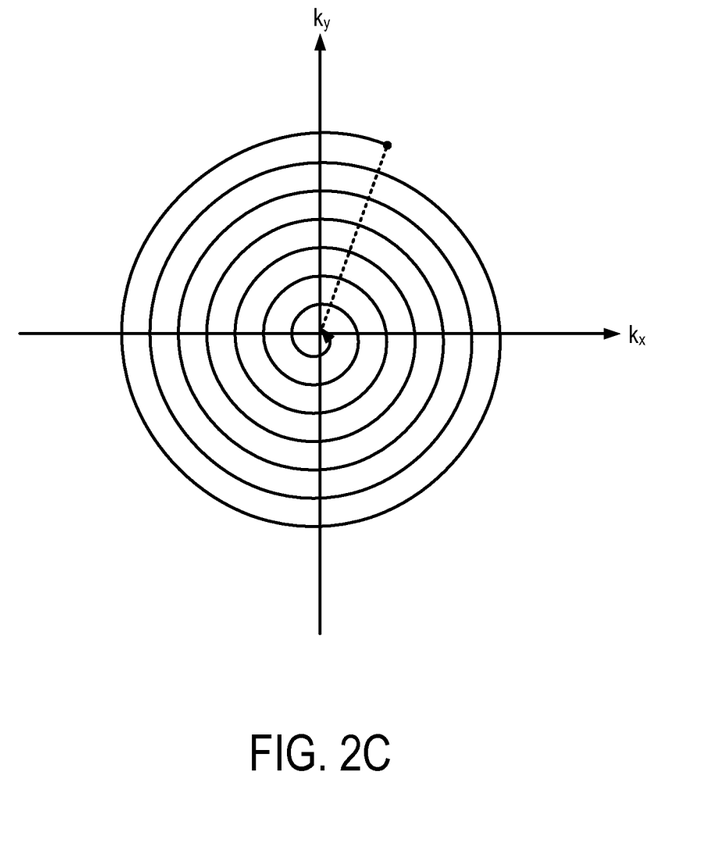
FIG. 2C is a graphic illustration of a spiral-in k-space sampling pattern employed by the pulse sequence of FIG. 2B.

After excitation of the spins in the slice, a prephasing gradient 257 is played out on both the phase encode and readout gradient axes to position the start of sampling at the periphery of k-space. Next, a phase encoding gradient pulse 258 is applied to position encode the MR signal along one direction in the slice. A readout gradient pulse 260 is also applied to position encode the MR signal along a second, orthogonal direction in the slice. The result of playing out the phase encoding gradient 258 and the readout gradient 260 together is the sampling of k-space in a spiral-in pattern, such as the one shown in FIG. 2C. With such a sampling pattern, the peripheral regions of k-space are acquired before the central region. As mentioned above, this allows the transverse magnetization to develop functional contrast before image data is acquired from the central region of k-space. This is advantageous since the central region of k-space contains most of the information regarding MR signal changes in response to neuronal activation. After the phase encoding 258 and readout gradient 260 are applied, a spoiler gradient 262 is applied to dephase any residual echo signal so that it does not contaminate signals acquired from later TR periods. In general, the spoiler gradient 262 can be played along any of the gradient axes. Moreover, a plurality of such spoiler pulses 262 may be played out along any combination of these gradient axes.

In at least one embodiment, the functional imaging portion 250 is repeated once before proceeding with subsequent repetitions of the dynamic imaging portion 200 of the pulse sequence. It is noted, however, that any number of repetitions of the functional imaging portion 250 may be employed depending on the desired imaging application. As will be described below in detail, the functional imaging portion acquires MR signal from a different imaging slice during each subsequent repetition. Additionally, after data has been acquired from each prescribed functional slice, further repetitions of the pulse sequence are employed to sample the slices again so that a time series of functional image data is acquired. Additionally, the dynamic portion 200 is repeated so that a time series of dynamic image data is acquired, as will be described below in detail.

Figure 3A:
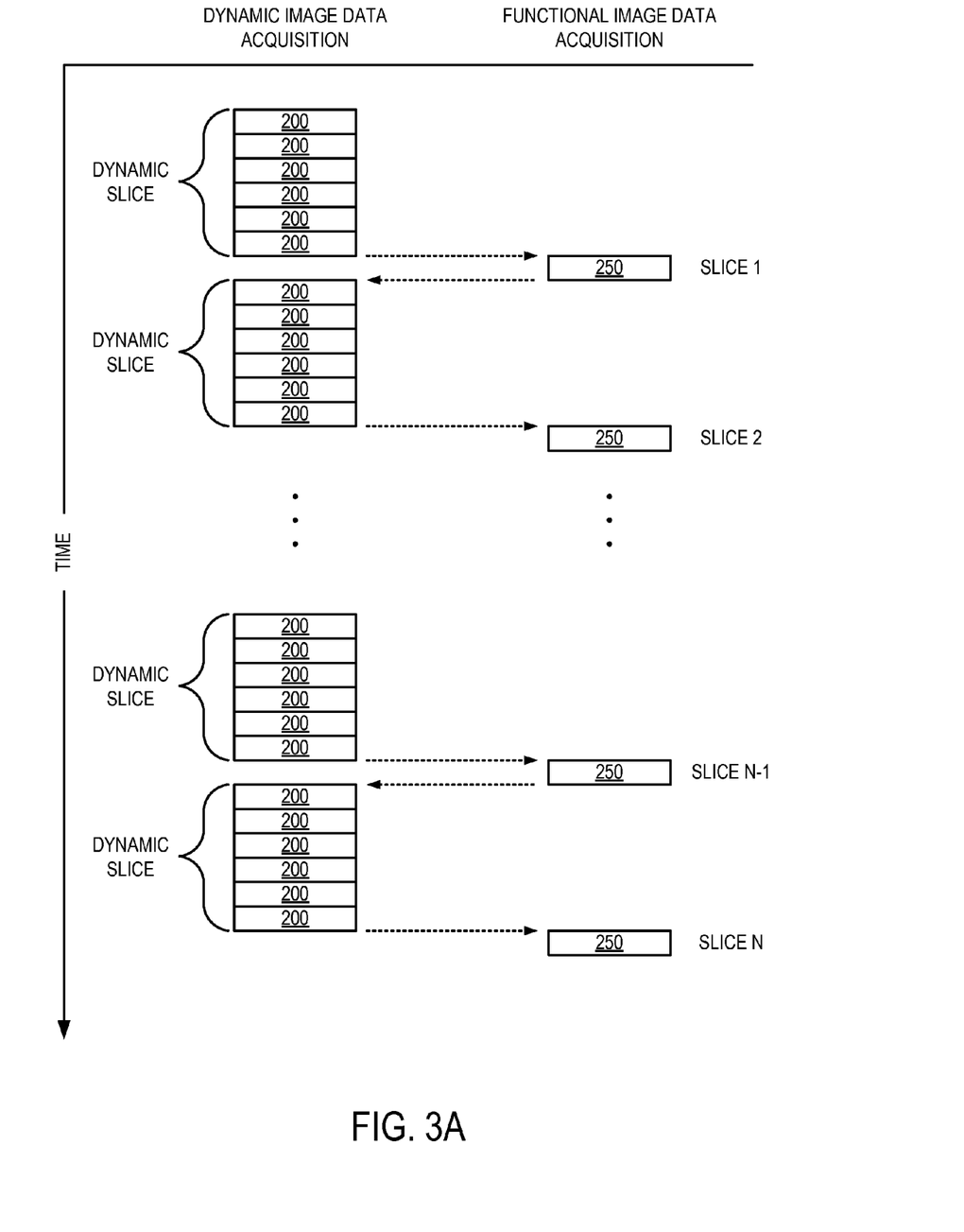
FIG. 3A is a graphic illustration of a data acquisition scheme utilizing the dynamic and functional imaging portions of the preferred pulse sequence of FIGS. 2A and 2B.
Figure 3B:
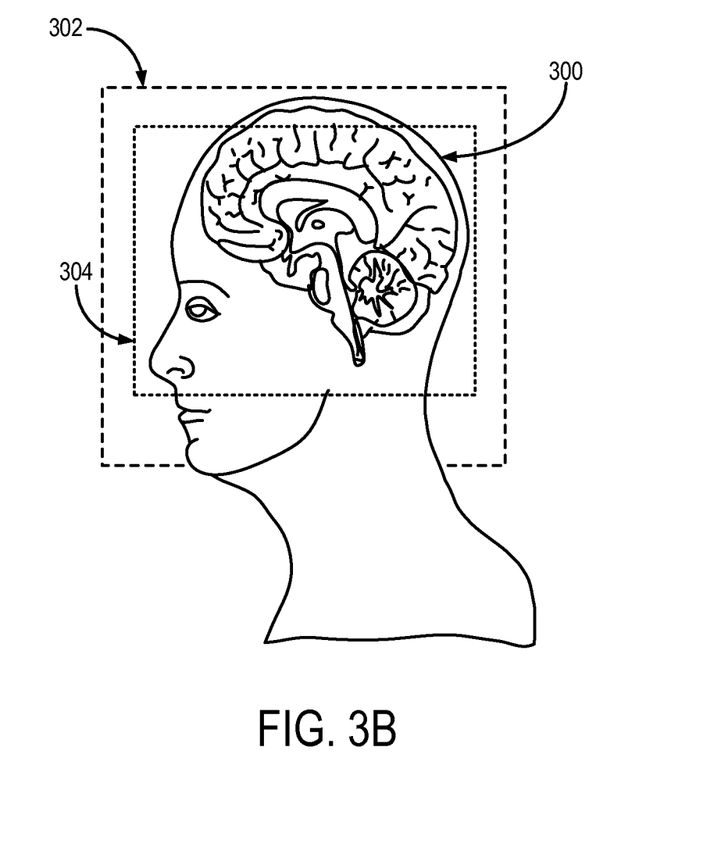
FIG. 3B is an graphic illustration of a volume of interest from which image data is acquired from a subject in accordance with the data acquisition scheme of FIG. 3A.

Referring particularly now to FIGS. 3A and 3B, the data acquisition scheme for an embodiment of the present invention is illustrated. As shown in FIG. 3A, the dynamic and functional imaging portions of the preferred pulse sequence are performed in an interleaved manner in order to acquire both dynamic and functional image data from a subject 300 (FIG. 3B). First, the dynamic acquisition 200 is repeated a plurality of times to acquire dynamic image data from a single "dynamic" slice 302 in the subject 300. An exemplary dynamic slice 302 is a sagittal slice that lies along the midline of the subject. In at least one embodiment, the dynamic imaging portion 200 is repeated six times before proceeding with the functional imaging portion 250 of the pulse sequence. In such embodiments, each repetition of the dynamic imaging portion 200 corresponds to a different shot of a spiral gradient echo acquisition. These individual shots are preferably interleaved spiral acquisitions; however, in the alternative, the data need not be acquired using an interleaved sampling pattern. Furthermore, and as mentioned above, the dynamic image data is acquired from this same slice location throughout the imaging session.

After the first set of dynamic image data has been acquired, the functional imaging portion 250 is performed once to acquire functional image data at a first slice location in an imaging volume 304. Exemplary functional slices in the imaging volume 304 are transverse slices; however, in the alternative, the functional slices may be coronal, sagittal, or oblique slices. Another set of the dynamic imaging portion 200 is subsequently applied to acquire another dynamic image data set from the same dynamic slice location 302. Likewise, after the set of the dynamic imaging portion 200 has been applied, one repetition of the functional imaging portion 250 is performed to acquire functional image data at a second slice location in the imaging volume 304. In the alternative, functional image data may be acquired from the same slice location a plurality of times before acquiring data from a different location. This process repeats until functional image data has been acquired from the desired number of slice locations in the imaging volume 304. After the functional imaging volume has been acquired, the aforementioned process repeats to acquire a time series of both the functional volume, or individual slices therein, and the dynamic images.

Figure 4:
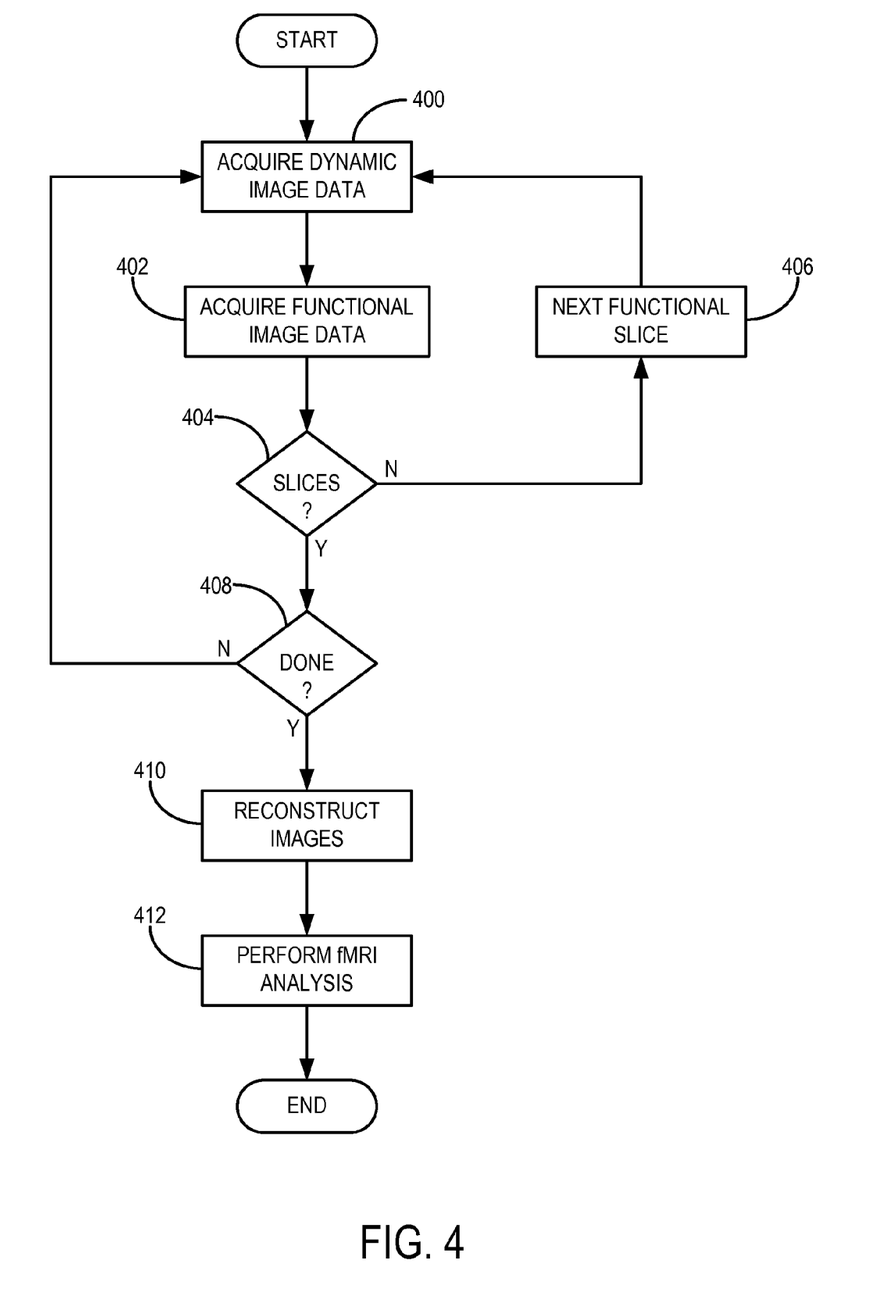
FIG. 4 is a flowchart setting forth the steps of an embodiment of the present invention.

Referring particularly now to FIG. 4, a flowchart setting forth the steps of an exemplary method for acquiring dynamic and functional image data in accordance with the present invention is illustrated. The method begins with the acquisition of dynamic image data, as indicated at step 400. After a set of dynamic image data has been acquired, functional image data is acquired at step 402. As discussed above, each functional image data set corresponds to one slice location in a volume of interest that encompasses the subject. Therefore, a decision is made at decision block 404 whether all of the desired functional image data slices have been acquired. If not, the process loops back to step 400 after selecting the next functional imaging slice location, as indicated at step 406. In this manner, one dynamic image is obtained for every functional image obtained. It is noted, however, as described above, the dynamic image data is acquired from the same slice location during each repetition. In the alternative, different slice locations at which dynamic image data is acquired can be selected during each repetition, as may be called for by the desired application. After all of the functional image data for one imaging volume has been acquired, a determination is made at decision block 408 whether the scanning session is completed. If not, the process loops back to acquire the next functional imaging volume, and corresponding dynamic image data, for the next set of time points in a time series. In this manner, time series of dynamic and functional image data are acquired such that functional MRI analyses can be performed later.

After all of the dynamic and functional image data has been acquired, corresponding dynamic and functional images are reconstructed, as indicated at step 410. A series of dynamic images is reconstructed from the dynamic image data. This is a conventional image reconstruction such as, for example, a regridding and Fourier transformation of the acquired dynamic image data. This series of dynamic images depicts the dynamic motion in the prescribed slice that occurred during the course of the imaging session. For example, the motion of muscles including the tongue and the levator veli palatini is represented in the series of dynamic images. In this manner, the series of dynamic images is indicative of the swallowing that the subject performed while being imaged. This information is later utilized to perform fMRI analysis on the functional images.

The series of functional images is reconstructed from the functional image data. This is a conventional image reconstruction. For example, the functional image data is regridded to a Cartesian grid and subsequently Fourier transformed to produce the functional images. Such a series of images includes images indicative of neuronal activation at a plurality of prescribed slice locations within the subject. Following the reconstruction of the dynamic and functional images, an fMRI analysis is performed on the functional images to determine the neuronal activity of the subject during the imaging session, as indicated at step 412.

Conventional fMRI analyses require a priori information regarding the timing of the performed functional task. Therefore, traditionally, functional paradigms are designed in either a block or event-related manner. However, when practicing the present invention, such a priori information is not necessary. Instead, the subject is allowed to freely perform a desired task, such as swallowing, throughout the acquisition of the image data. The reconstructed dynamic images are then utilized to retrospectively generate a timing sequence for the performed task. In this manner, the acquired functional image data is not confounded by extraneous neuronal activation corresponding to stimuli presented to the subject.

Figure 5:
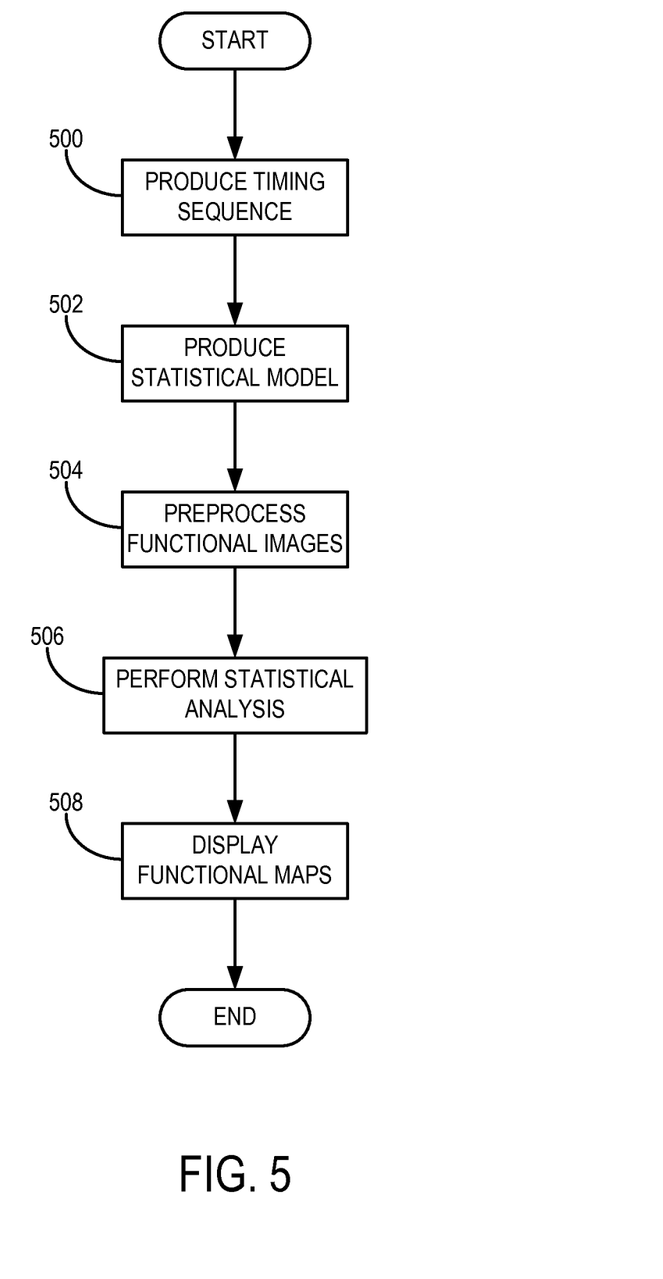
FIG. 5 is a flowchart setting forth the steps of an embodiment of the functional magnetic resonance imaging (fMRI) analysis performed in accordance with the embodiment of the present invention set forth in FIG. 4.

Referring particularly now to FIG. 5, the steps of an embodiment of the functional MRI ("fMRI") analysis performed when practicing the present invention are illustrated. First, as discussed above, the reconstructed dynamic images are utilized to produce a timing sequence of the performance of the desired task, as shown at step 500. For example, the series of dynamic images is analyzed to determine time points during the data acquisition at which the subject swallowed. These time points are recorded and a timing sequence corresponding to the performance of the swallow task produced therefrom. This timing sequence is subsequently used to produce a mathematical model of the expected hemodynamic response produced by the neuronal activation, as shown at step 502. It will be appreciated by those skilled in the art that an exemplary mathematical model includes the so-called general linear model ("GLM") utilizing a standard BOLD response or hemodynamic response function. The functional images are then preprocessed prior to the statistical analysis, as shown at step 504. Preprocessing includes smoothing the functional images with a Gaussian filter, correcting the functional images for subject motion, and normalization of the functional images to a reference atlas, such as a Talairach coordinate reference. It will be appreciated by those skilled in the art that any number of preprocessing steps can be performed or omitted, and the performance of such steps is dictated by user preference and the application at hand.

After the functional images have been preprocessed, a statistical analysis is performed on the images to identify signal changes in voxels indicative of neuronal activation, as indicated at step 506. For example, a statistical analysis is performed in accordance with the GLM. In such a method, each voxel is analyzed to detect those whose signal variation in time corresponds to the timing sequence produced earlier. Finally, the functional maps produced by the statistical analysis are displayed at step 508. The functional maps can be displayed directly, or can be displayed as an overlay on a high resolution anatomical image of the corresponding slice location in the subject. With the latter method of display, it is easier to visually interpret the location of neuronal activation in the subject's brain, as is well know in the art.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image indicative of neuronal activation associated with the motion performed by a subject, with a magnetic resonance imaging (MRI) system, the steps comprising:
   A) acquiring, with the MRI system, dynamic image data from a slice location in the subject;
   B) acquiring, with the MRI system, functional image data from a functional slice location in the subject;
   C) repeating steps A) and B), wherein functional image data is acquired at successively different functional slice locations during each repetition of step B);
   D) reconstructing, from the dynamic image data acquired in steps A) and C), a series of dynamic images that depicts motion of at least one anatomical feature of the subject that occurred substantially simultaneously with the acquisition of the functional image data in steps B) and C);
   E) reconstructing, from the functional image data acquired in steps B) and C), a series of functional images that is indicative of neuronal activity in the subject;
   F) analyzing the series of dynamic images in order to determine time points at which the subject moved the at least one anatomical feature; and
   G) producing an image indicative of neuronal activity in the subject that is associated with the subject performing the motion of the at least one anatomical feature by using the time points determined in step F) in order to analyze the series of functional images reconstructed in step E).

2. The method as recited in claim 1, in which step A) includes performing a spoiled gradient recalled echo pulse sequence in order to direct the MRI system to acquire the dynamic image data.

3. The method as recited in claim 1, in which step B) includes performing a pulse sequence in order to direct the MRI system and in order to acquire the functional image data using a sampling pattern that samples a peripheral region of k-space before sampling a central region of k-space.

4. The method as recited in claim 3, in which the pulse sequence is a spiral-in gradient echo recalled pulse sequence.

5. The method as recited in claim 1, in which step G) includes:
using the time points determined in step F), in order to produce a model of an expected hemodynamic response that is produced by the neuronal activity associated with the subject performing the motion of the at least one anatomical feature; and
wherein producing the image indicative of the neuronal activity in the subject that is associated with the subject performing the motion of the at least one anatomical feature includes:
analyzing the series of functional images reconstructed in step E), by using the produced model of the expected hemodynamic response.

6. The method as recited in claim 5, in which step G) includes:
analyzing the series of functional images reconstructed in step E), by correlating image intensity values within the series of functional images to the neuronal activity associated with the motion of the at least one anatomical feature, by using the produced model of the expected hemodynamic response.

7. The method as recited in claim 1 in which:
steps A)-C) are repeated in order to acquire a time series of dynamic image data and functional image data;
the series of dynamic images reconstructed in step D) is a time series of dynamic images indicative of the motion of the at least one anatomical feature in the subject; and
the series of functional images reconstructed in step E) is a time series of functional images.

8. The method as recited in claim 7, in which the at least one anatomical feature is the tongue.

9. The method as recited in claim 7, in which step F) includes:
producing, from the reconstructed time series of dynamic images, a timing sequence indicative of times at which the motion of the at least one anatomical feature occurred.

10. The method as recited in claim 9, in which step G) includes:
G) i) producing a functional signal model using the times in the timing sequence that are indicative of when the motion of the at least one anatomical feature occurred; and
G) ii) correlating image intensity values in the time series of functional images to the neuronal activity associated with the motion of the at least one anatomical feature using the functional signal model.

11. The method as recited in claim 1, in which the dynamic images are used in order to monitor performance of a functional task.

12. The method as recited in claim 1 in which the dynamic images are used in determining modulations, in a biomechanical performance of a motor task, in order to determine a neural control of the motor task.

13. A method for producing, with a magnetic resonance imaging (MRI) system, an image indicative of neuronal activation associated with the motion performed by a subject, the steps comprising:
A) acquiring, with the MRI system, dynamic image data from a slice location in the subject;
B) acquiring, with the MRI system, functional image data from a functional slice location in the subject;
C) repeating steps A) and B), a plurality of times in order to acquire a time series of dynamic image data and a time series of functional image data, wherein the functional image data is acquired at successively different functional image slice locations during each repetition of step B);
D) reconstructing a time series of dynamic images from the dynamic image data acquired in steps A) and C), the time series of dynamic images depicting a motion of at least one anatomical feature of the subject that occurred substantially simultaneously with the acquisition of the functional image data in steps B) and C);
E) reconstructing a time series of functional images from the functional image data acquired in steps B) and C);
F) producing a timing sequence using the time series of dynamic images, the timing sequence being indicative of those times at which the subject performed motion of the at least one anatomical feature; and
G) producing, using the timing sequence and the time series of functional images, an image indicative of neuronal activation in the subject produced in association with the motion of the at least one anatomical feature.

14. The method as recited in claim 13, in which step F) includes identifying dynamic images in the time series of dynamic images in which the at least one anatomical feature is undergoing motion and recording the times associated with the identified dynamic images.

15. The method as recited in claim 14, in which step G) includes:
producing a functional signal model using the recorded times associated with the identified dynamic images; and
using the functional signal model in order to correlate image intensity values in the time series of functional images to the neuronal activity associated with the motion of the at least one anatomical feature.

16. The method as recited in claim 14, in which
the at least one anatomical feature is the tongue and
the identified dynamic images are indicative of when the subject is swallowing.

* * * * *